United States Patent
Ashizawa et al.

(10) Patent No.: US 11,802,085 B2
(45) Date of Patent: Oct. 31, 2023

(54) COMPOSITE STRUCTURE AND SEMICONDUCTOR MANUFACTURING APPARATUS INCLUDING COMPOSITE STRUCTURE

(71) Applicant: TOTO LTD., Kitakyushu (JP)

(72) Inventors: Hiroaki Ashizawa, Kitakyushu (JP); Ryoto Takizawa, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 271 days.

(21) Appl. No.: 17/244,247

(22) Filed: Apr. 29, 2021

(65) Prior Publication Data

US 2021/0340066 A1 Nov. 4, 2021

(30) Foreign Application Priority Data

Apr. 30, 2020 (JP) .................. 2020-080287
Apr. 30, 2020 (JP) .................. 2020-080288
Mar. 18, 2021 (JP) .................. 2021-045299

(51) Int. Cl.
  *C04B 35/44* (2006.01)
  *B82Y 40/00* (2011.01)
  (Continued)

(52) U.S. Cl.
  CPC .............. *C04B 35/44* (2013.01); *B82Y 30/00* (2013.01); *B82Y 40/00* (2013.01); *H01J 37/32467* (2013.01); *H01J 2237/3341* (2013.01)

(58) Field of Classification Search
  CPC . C04B 35/44; C04B 35/62218; C04B 41/009; C04B 41/87; C04B 41/5032;
  (Continued)

(56) References Cited

U.S. PATENT DOCUMENTS 10,119,188 B2   11/2018 Sun et al.
2003/0087751 A1*  5/2003 Hamada ............... C04B 35/44
                                                            501/153
(Continued)

FOREIGN PATENT DOCUMENTS

CN    105247662 A    1/2016
JP    2003297809 A   10/2003
(Continued)

OTHER PUBLICATIONS

Office Action dated Apr. 27, 2022 issued in the corresponding Taiwanese Patent Application.
(Continued)

*Primary Examiner* — Humera N. Sheikh
*Assistant Examiner* — Kevin C T Li
(74) *Attorney, Agent, or Firm* — Carrier, Shende & Associates P.C.; Fulchand P. Shende; Joseph P. Carrier

(57) ABSTRACT

Disclosed is to provide a composite structure used as a member for a semiconductor manufacturing apparatus with which low-particle generation can be improved, as well as a semiconductor manufacturing apparatus including the same. A composite structure including a base material and a structure that is provided on the base material and has a surface, in which the structure comprises $Y_3Al_5O_{12}$ as a main component, and has an indentation hardness being larger than 8.5 GPa features excellent low-particle generation and is suitably used as a member for a semiconductor apparatus.

14 Claims, 4 Drawing Sheets

(51) Int. Cl.
*H01J 37/32* (2006.01)
*B82Y 30/00* (2011.01)

(58) Field of Classification Search
CPC ...... C04B 2235/5436; C04B 2235/764; C04B 2235/781; C04B 2235/96; C04B 2235/9669; C04B 2235/3225; C23C 14/08; C23C 16/40; C23C 24/04; B82Y 30/00; B82Y 40/00; H01J 37/32467; H01J 2237/3341
See application file for complete search history.

(56) References Cited

U.S. PATENT DOCUMENTS

| | | | |
|---|---|---|---|
| 2008/0108225 A1* | 5/2008 | Sun | C23C 14/564 438/758 |
| 2008/0283499 A1 | 11/2008 | Nakahara et al. | |
| 2012/0126173 A1 | 5/2012 | Nass | |
| 2014/0154465 A1* | 6/2014 | Sun | H01L 21/6831 156/89.12 |
| 2014/0377504 A1 | 12/2014 | Sun et al. | |
| 2019/0305652 A1 | 10/2019 | Hirabayashi et al. | |

FOREIGN PATENT DOCUMENTS

| | | |
|---|---|---|
| JP | 2016-528380 A | 9/2016 |
| JP | 2019-176593 A | 10/2019 |
| KR | 20080036530 A | 4/2008 |
| KR | 20150092227 A | 8/2015 |

OTHER PUBLICATIONS

Office Action dated Oct. 26, 2021 issued in the corresponding Japanese Patent Application No. 2021-045299.
Office Action dated Feb. 22, 2022 issued in the corresponding Japanese Patent Application No. 2021-045299.
Masato Suzuki et al., "Control of Structure and Properties on Al2O3/YAG Composite Coating Prepared by Plasma Spray Process", Japan Institute of Metals, vol. 69. No. 1 (2005), pp. 23-30.
Office Action dated Nov. 22, 2021 issued in the corresponding TW Patent Application.
Takeshi Sawa, Correlation between Nanoindentation Test Result and Vickers Hardness, Oral Session II: Hardness Measurement, Thailand: Nov. 22-25, 2010, pp. 171-174.
G. De With et al., Translucent Y3Al5O12 Ceramics: Mechanical Properties, Solid State Ionics 16 (1985), pp. 87-93, North-Holland Publishing Company.
Notice of the Third-Party Submission dated Oct. 4, 2022 in the corresponding Korean Patent Application No. 10-2021-0055503.
Office Action, Notice of Preliminary Rejection, dated Oct. 17, 2022, issued in the corresponding Korean Patent Application No. 10-2021-0055503.
Office Action dated May 2, 2023, issued in the corresponding Chinese Patent Application.

* cited by examiner

COMPOSITE STRUCTURE AND SEMICONDUCTOR MANUFACTURING APPARATUS INCLUDING COMPOSITE STRUCTURE

TECHNICAL FIELD

The present invention relates to a composite structure with excellent low-particle generation property to be suitably used as a member for a semiconductor manufacturing apparatus, and a semiconductor manufacturing apparatus including the same.

BACKGROUND ART

There has been known a technology with which a substrate is imparted with a function by means of coating a surface thereof with a ceramics. For instance, as a member for a semiconductor manufacturing apparatus used under a plasma exposure environment, a member having highly plasma resistant coating formed on its surface has been used. As the coating, for example, oxide-based ceramics such as alumina ($Al_2O_3$) or yttria ($Y_2O_3$), or fluoride-based ceramics such as yttrium fluoride ($YF_3$) or yttrium oxyfluoride (YOF) is used.

Regarding the oxide-based ceramics, the plasma resistant coating using a material such as erbium oxide ($Er_2O_3$) or $Er_3Al_5O_{12}$, gadolinium oxide ($Gd_2O_3$) or $Gd_3Al_5O_{12}$, yttrium aluminum garnet (YAG:$Y_3Al_5O_{12}$), $Y_4Al_2O_9$, or the like has been proposed (JP 2016-528380 A (PLT 1)). Due to miniaturization of semiconductors, a higher level of low-particle generation has been required for various members in the semiconductor manufacturing apparatus.

We have now found that there is a correlation between the hardness of a structure including, as a main component, an yttrium-aluminum oxide $Y_3Al_5O_{12}$ (hereinafter, referred to as "YAG") and low-particle generation that is an index of particle generation due to plasma corrosion, and we have successfully provided a structure with excellent low-particle generation.

Thus, an object of the present invention is to provide a composite structure with excellent low-particle generation. A further object is to enable such a composite structure to be used as a member of a semiconductor manufacturing apparatus and to provide a semiconductor manufacturing apparatus using the same.

A composite structure according to the present invention comprising: a base material; and a structure provided on the base material and has a surface, wherein the structure comprises $Y_3Al_5O_{12}$ as a main component, and has an indentation hardness being larger than 8.5 GPa.

The composite structure according to the present invention can be used in an environment requiring low-particle generation.

A semiconductor manufacturing apparatus according to the present invention includes the composite structure according to the present invention described above.

COMPOSITE STRUCTURE

Figure 1:
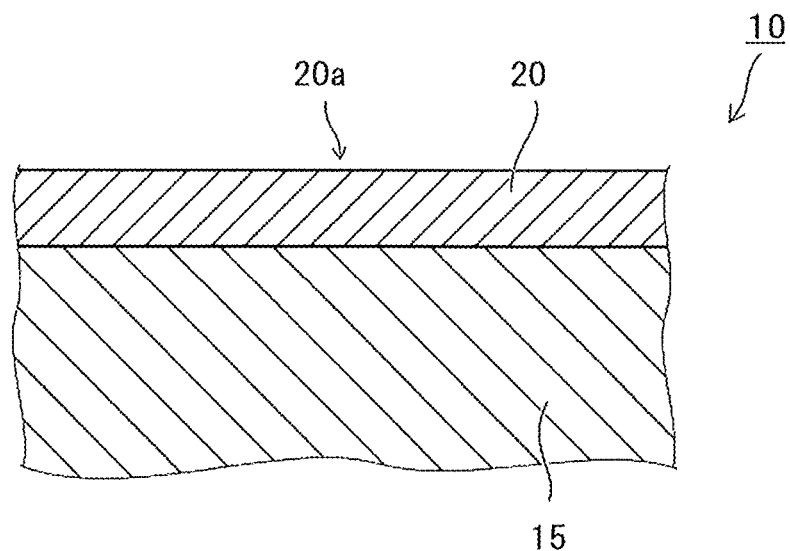
FIG. 1 is a schematic-cross sectional view of a member including a structure of the present invention.

A basic structure of a composite structure according to the present invention will be described with reference to FIG. 1. FIG. 1 is a schematic cross-sectional view of a composite structure 10 according to the present invention. The composite structure 10 includes a structure 20 provided on a base material 15, and the structure 20 has a surface 20a.

The structure 20 of the composite structure of the present invention is what is known as a ceramic coating. With the ceramic coating provided, the base material 15 can have various physical properties/characteristics. The structure (or the ceramic structure) and the ceramic coating are synonymously used herein unless noted otherwise.

For example, the composite structure 10 is provided inside a chamber of a semiconductor manufacturing apparatus including the chamber. Fluorine based gas, such as SF based gas or CF based gas, is introduced into the chamber to generate plasma, whereby the surface 20a of the structure 20 is exposed to the plasma environment. Thus, low-particle generation is required for the structure 20 at the surface of the composite structure 10. The composite structure of the present invention may be used as a member mounted to a part other than the inside of the chamber. In this specification, the semiconductor manufacturing apparatus for which the composite structure according to the present invention is used is meant to include any semiconductor manufacturing apparatus (semiconductor processing apparatus) executing processing such as annealing, etching, sputtering, or CVD.

Base Material

In the present invention, the base material 15, which is not particularly limited as long as it is used for its purpose, is configured to include alumina, quartz, anodized aluminum (alumite), metal, or glass, and is preferably configured to include alumina. According to a preferred embodiment of the present invention, an arithmetic average roughness Ra (JISB0601:2001) of a surface of the base material 15 on which the structure 20 is formed is, for example, less than 5 micrometers (μm), preferably less than 1 μm, and is more preferably less than 0.5 μm.

Structure

The structure of the present invention includes YAG as a main component. According to one embodiment of the present invention, YAG is a polycrystalline substance.

In the present invention, the main component of the structure is a compound that is contained in the structure 20 by an amount relatively larger than those of other compounds, as identified by quantitative or semi-quantitative analysis with X-ray diffraction (XRD). For example, the main component is a compound of the largest amount included in the structure. The ratio of the main component in the structure, which is volume ratio or mass ratio, is 50% or more. Furthermore, the ratio of the main component is preferably more than 70%, and is also preferably more than 90%. The ratio of the main component may even be 100%.

The component that may be included in the structure of the present invention in addition to YAG includes an oxide such as yttrium oxide, scandium oxide, europium oxide, gadolinium oxide, erbium oxide, or ytterbium oxide, and a fluoride such as yttrium fluoride or yttrium oxyfluoride. Furthermore, two or more, that is, a plurality of these may be included.

In the present invention, the structure is not limited to a single layer structure, and may be a multilayer structure. A plurality of layers having YAG of different compositions as main components may be included. A different layer, a layer including $Y_2O_3$ for example may be provided between the base material and the structure.

Indentation Hardness

The structure including YAG as the main component of the present invention is assumed to have indentation hardness larger than 8.5 GPa. Thus, low-particle generation can be improved. According to a preferred embodiment of the present invention, the indentation hardness is 10 GPa or more, and is more preferably 13 GPa or more. The upper limit of the indentation hardness which is not particularly limited, may be determined by its required characteristics, and is 20 GPa or less for example.

Here, the indentation hardness of the structure is measured by the following method. Specifically, the hardness can be measured by performing nano indentation on the surface of the structure, on the base material, including the YAG as a main component. The indentation hardness $H_{IT}$ is measured with a Berkovich indenter used as an indenter, and with the indentation depth being a fixed value of 200 nm. As the $H_{IT}$ measured portion on the surface, a surface without scratches or pores is selected. More preferably, the surface is polished to be a smooth surface. The measurement is performed at 25 points or more. An average of values $H_{IT}$ measured at the 25 or more points is obtained as the hardness of the present invention. Other test methods and analysis methods, a procedure for confirming the performance of the test apparatus, and a condition required for a standard reference sample conform to ISO14577.

In the semiconductor manufacturing apparatus, highly corrosive fluorine based plasma, using CF based gas, SF based gas, or the like, is used. The structure of the present invention including YAG as a main component involves only a small change in the crystal structure even after being fluorinated by being exposed to such fluorine based plasma. Thus, even during use to be under exposure of the corrosive plasma, a change in the crystal structure of the structure surface is expected to be suppressed, and a lower particle contamination is expected to be achievable.

According to one embodiment of the present invention, when YAG included in the structure is a polycrystalline substance, the average crystallite size thereof is, for example, less than 100 nm, preferably less than 50 nm, more preferably less than 30 nm, and most preferably less than 20 nm. With a small average crystallite size, the particle diameter generated by plasma can be small.

As used herein, the "polycrystalline substance" is a structure in which crystal particles are bonded/integrated. Preferably, a substantially single crystal particle forms a crystal. The diameter of the crystal particle is, for example, 5 nanometers (nm) or more.

In the present invention, the crystallite size is measured by X-ray diffraction for example. As the average crystallite size, a crystallite size can be calculated using the following Scherrer's formula:

$D=K\lambda/(\beta\cos\theta)$, where

D represents the crystallite size, β represents full width at half maximum (unit: radian (rad)), θ represents a Bragg angle (unit: rad), and λ represents the wavelength of characteristic X-ray used for the XRD.

In the Scherrer's formula, β is calculated by β=(βobs−βstd), βobs represents the half width of the X-ray diffraction peak of the measurement sample, βstd represents the half width of the X-ray diffraction peak of the standard, and K represents a Sheller constant.

The X-ray diffraction peak usable for the calculation of the crystallite size in the YAG includes peaks in a cubic crystal of YAG includes: a peak around a diffraction angle 2θ=17.9° pertaining to a Miller index (hkl)=(211); a peak around a diffraction angle 2θ=27.6° pertaining to a Miller index (hkl)=(321); a peak around a diffraction angle 2θ=29.5° pertaining to a Miller index (hkl)=(400); and a peak around a diffraction angle 2θ=33.1° pertaining to a Miller index (hkl)=(420).

The crystallite size may be calculated from an image obtained by an observation using a Transmission Electron Microscope (TEM). For example, an average value of a circle equivalent diameter of the crystallite may be used as the average crystallite size.

According to an embodiment where the YAG is a polycrystal, a distance between crystallites adjacent to each other is preferably 0 nm or more and less than 10 nm. The distance between the crystallites adjacent to each other is the closest distance between the crystallites, and does not include an air gap formed by the plurality of crystallites. The distance between the crystallites can be obtained from an image obtained through an observation using the TEM.

Fluorine Penetration Depth

According to a preferred embodiment of the present invention, the composite structure of the present invention is structured to exhibit low-particle generation preferably achieving a fluorine atom concentration smaller than a predetermined value at a predetermined depth from the surface, upon being exposed to a particular fluorine based plasma. The composite structure according to this embodiment of the present invention achieves the predetermined value of the fluorine atom concentration at the depths from the surface as described below, upon being exposed to the fluorine based plasma under the following three conditions. The tests according to the present invention involving exposure to the fluorine based plasma under the three conditions are respectively referred to as Standard Plasma Tests 1 to 3.

Standard Plasma Tests 1 to 3 assume various expected conditions in the semiconductor manufacturing apparatus. Standard Plasma Tests 1 and 2 relate to conditions involving application of bias power. Specifically, the test condition assumes the use of the structure as a member such as a focus ring positioned around a silicon wafer inside the chamber and exposure of the structure to a corrosion environment due to radical and ion collision. With Standard Plasma Test 1, the performance against $CHF_3$ plasma is evaluated, whereas with Standard Plasma Test 2, the performance against $SF_6$ plasma is evaluated. Meanwhile, Standard Plasma Test 3 relates to a condition involving no bias application. Specifically, the test condition assumes the use of the structure as a side wall member arranged substantially orthogonal to the silicon wafer or a top plate member facing the silicon wafer in the chamber and exposure of the structure to a corrosion environment mainly due to radical with fewer events of ion collision. According to a preferred embodiment of the present invention, the composite structure of the present invention achieves the predetermine value of the fluorine concentration after at least any one of these tests.

(1) Plasma Exposure Condition

A surface of a structure, on a base material, including YAG as a main component, is exposed to a plasma environment using an Inductively Coupled Plasma Reactive Ion Etching (ICP-RIE) apparatus. The plasma environment is formed under the following three conditions.

Standard Plasma Test 1:
Process gas: mixture gas of $CHF_3$ (100 sccm) and $O_2$ (10 sccm)
Power output: 1500 W (ICP coil output)
Bias output: 750 W Standard Plasma Test 2:
Process gas: $SF_6$ (100 sccm)
Power output: 1500 W (ICP coil output)
Bias output: 750 W Standard Plasma Test 3:
Process gas: $SF_6$ (100 sccm)
Power output: 1500 W (ICP coil output)
Bias output: OFF (0 W)
Thus, no application to biasing radio frequency power of an electrostatic chuck.

Standard Plasma Tests 1 to 3 are also performed under the common conditions that chamber pressure is 0.5 Pa and that plasma exposure time is one hour. A member for the semiconductor manufacturing apparatus is arranged on a silicon wafer sucked by the electrostatic chuck of the ICP-RIE apparatus to expose the structure surface to the plasma atmosphere formed under such conditions.

(2) Method of Measuring Fluorine Atom Concentration of Structure Surface in Depth Direction The fluorine (F) atom concentration (%) relative to the sputtering time was measured for the surface of the structure after Standard Plasma Tests 1 to 3, using X-ray Photoelectron Spectroscopy (XPS) and through depth direction analysis using ion sputtering. Then, a probe type surface shape measurement device was used to measure a level difference (s) between portions subjected and not subjected to the ion sputtering, to convert the sputtering time into depth. Based on the level difference (s) and the total sputtering time (t) used in the XPS measurement, the depth (e) relative to the sputtering unit time was calculated by e=s/t. Then, the sputtering time was converted into depth using the depth (e) relative to the sputtering unit time. Finally, the depth from the surface 20a and the fluorine (F) atom concentration (%) at the depth position were calculated.

With the present embodiment, the composite structure according to the present invention achieves the fluorine atom concentration at each of the following depths from the surface after Standard Plasma Tests 1 to 3.

After Standard Plasma Test 1:
A fluorine atom concentration at the depth of 30 nm from the surface, $F1_{30\ nm}$, is less than 3% and/or a fluorine atom concentration at the depth of 20 nm from the surface, $F1_{20\ nm}$, is less than 4%. More preferably, at least one of $F1_{30\ nm}$ and $F1_{20\ nm}$ is 2% or less.

After Standard Plasma Test 2:
A fluorine atom concentration at the depth of 30 nm from the surface, $F2_{30\ nm}$, is less than 2% and/or fluorine atom concentration at the depth of 15 nm from the surface, $F2_{20\ nm}$, is less than 3%. More preferably, $F2_{30\ nm}$ is 1% or less and/or $F2_{15\ nm}$ is 2% or less.

After Standard Plasma Test 3:
A fluorine atom concentration at the depth of 20 nm from the surface, $F3_{20\ nm}$, is less than 8% and/or a fluorine atom concentration at the depth of 10 nm from the surface, $F3_{10\ nm}$, is less than 9%. More preferably, $F3_{20\ nm}$ is 7% or less and/or $F3_{10\ nm}$ is 8% or less. Even more preferably, $F3_{20\ nm}$ is 1% or less and/or $F3_{10\ nm}$ is 2% or less.

Manufacturing of Composite Structure

The composite structure according to the present invention can be formed, for example, by arranging fine particles including a brittle material on a surface of a base material, and applying mechanical impact force on the fine particles. Here, a method of "applying mechanical impact force" includes: using a high-speed rotating brush or roller with high hardness or a piston moving up and down at high speed; using compressive force due to shockwaves produced by explosion; applying ultrasonic waves; or a combination of these.

The composite structure according to the present invention can be preferably manufactured by aerosol deposition. This "aerosol deposition" is a method including the following procedures. Specifically, "aerosol" with the fine particles including the brittle material dispersed in gas is injected toward the base material through a nozzle, to make the fine particles collide with a base material such as metal, glass, ceramics, or plastic. The fine particles including the brittle material are deformed and crushed through the impact of the collision. As a result, the particles are bonded to each other, whereby a structure including a component of the fine particles is formed directly on the base material, to be a layer-shaped structure or a film-shaped structure for example. With this method, no heating means, cooling means, or the like is required in particular, the structure can be formed at a normal temperature, and a structure having a mechanical strength that is equal to or greater than that of a sintered body can be obtained. The density, the mechanical strength, electric property, and the like of the structure can be changed in various ways, by controlling matters such as the condition under which the fine particles collide and the shape and composition of the fine particles.

The term "fine particles" as used herein refers to particles with an average particle size of 5 micrometers (μm) or less as identified by particle size distribution measurement and scanning electron microscope if the primary particles are dense particles, or to particles with an average particle size of 50 micrometers (μm) or less if the primary particles are porous particles that are easily crushed by the impact.

The term "aerosol" as used herein refers to a solid-air mixed phase material formed by dispersing the fine particles described above in gas (carrier gas) such as helium, nitrogen, argon, oxygen, dry air, or mixed gas including these. The term does cover a case where "aggregates" are included, but preferably refers to a state where fine particles are substantially individually dispersed. The gas pressure and temperature of the aerosol may be set as appropriate based on the physical properties of the desired structure. Still, the concentration of the fine particles in the gas at the point of injection from the discharge port is preferably within a range from 0.0003 mL/L to 5 mL/L, with the gas pressure being 1 atm and the temperature being 20° C.

The process of aerosol deposition is usually executed under a normal temperature, and the structure can be formed at a temperature substantially lower than a melting point of the material of the fine particles, that is, several hundred degrees Celsius or lower. The term "normal temperature" as used herein is a temperature much lower than the sintering temperature of ceramics, and refers to a room temperature environment that is substantially in a range from 0 to 100° C. The term "powder" as used herein refers to a state where the fine particles described above are spontaneously aggregated.

EXAMPLES

The present invention is further described with reference to the following Examples. Note that the present invention is not limited to these Examples.

Raw materials as expressed in the following tables were prepared as the raw materials of structures used in Examples.

TABLE 1

| Raw material | Composition | D50 (μm) |
|---|---|---|
| F1 | $Y_3Al_5O_{12}$ | 2.5 |
| F2 | $Y_3Al_5O_{12}$ | 2.2 |

In the table, the median diameter (D50 (μm)) refers to a diameter corresponding to 50% in a cumulative distribution of particle diameter of each raw material. As the diameter of each particle, a diameter obtained by circular approximation is used.

A plurality of samples including a structure on a base material was prepared, with a combination between these raw materials and a film formation condition (such as the type and the flowrate of the carrier gas) varied. The low-particle generation of the obtained samples after Standard Plasma Tests 1 to 3 was evaluated. In this example, the samples were prepared by aerosol deposition.

TABLE 2

| Sample | Raw material | Gas | Flow-rate (L/min) | Film thickness (μm) | Hardness (GPa) | Plasma corrosion Test 1 | Test 2 | Test 3 | Total |
|---|---|---|---|---|---|---|---|---|---|
| 1 | F1 | He | 10 | 5.8 | 15.5 | A | A | A | A |
| 2 | F2 | He | 15 | 8.7 | 13.8 | A | A | A | A |
| 3 | F1 | N2 | 10 | 6.6 | 13.3 | A | A | A | A |
| 4 | F2 | He | 10 | 7.8 | 13.1 | A | A | A | A |
| 5 | F2 | N2 | 10 | 5.1 | 10.6 | B | B | B | B |
| 6 | F2 | N2 | 5 | 5.0 | 8.4 | C | C | C | C |

As illustrated in the table, nitrogen ($N_2$) or helium (He) is used as the carrier gas. The aerosol is obtained by mixing the carrier gas with material powder (material fine particles) in an aerosol generator. The aerosol thus obtained is injected toward the base material arranged inside a film formation chamber, through a nozzle connected to the aerosol generator, by means of pressure difference. In this process, the air in the film formation chamber has been discharged to the outside by means of a vacuum pump.

Sample

The structures of Samples 1 to 6 obtained as described above each include a YAG polycrystalline substance as a main component, with the average crystallite size of the polycrystalline substance being less than 30 nm in any of these.

The crystallite size was measured using XRD. Specifically, as the XRD apparatus, "X'PertPRO/available from PANalytical" was used. The XRD measurement conditions were as follows: CuKα (λ=1.5418 Å) used as characteristic X-ray; tube voltage of 45 kV; tube current of 40 mA; Step Size of 0.0084°; and Time per Step of 80 seconds or more. As the average crystallite size, the crystallite size was calculated using the Sheller's formula described above, with the value of K in the Sheller's formula being 0.94.

The main component of the crystal phase of the YAG on the base material was measured by XRD. Specifically, as the XRD apparatus, "X'PertPRO/available from PANalytical" was used. The XRD measurement conditions were as follows: CuKα (λ=1.5418 Å) used as characteristic X-ray; tube voltage of 45 kV; tube current of 40 mA; Step Size of 0.0084°; and Time per Step of 80 seconds or more. The main component was calculated using XRD analysis software "High Score Plus/available from PANalytical". The calculation was made based on a relative strength ratio obtained by a peak search on a diffraction peak, using Reference Intensity Ratio (RIR) written on an ICDD card. For the measurement of the main component of a polycrystal of YAG in a case of laminated structure, a measurement result for a region at a depth that is less than 1 μm from the outermost surface, obtained by thin film XRD is preferably used.

Standard Plasma Test

Standard Plasma Tests 1 to 3 under the conditions described above were performed on these Samples 1 to 6, and the low-particle generation after the test was evaluated through the following procedure. As the ICP-RIE apparatus, "Muc-21 Rv-Aps-Se/available from Sumitomo Precision Products" was used. Standard Plasma Tests 1 to 3 were performed also under the common conditions that chamber pressure is 0.5 Pa and plasma exposure time is one hour. The sample was arranged on the silicon wafer sucked by the electrostatic chuck of the ICP-RIE apparatus to expose the structure surface to the plasma atmosphere formed under such conditions.

Measurement of Indentation Hardness

The indentation hardness of the structure on the base material was measure by nano indentation through the following procedure. As the nano indentation hardness tester (nano indenter), "ENT-2100/available from ELIONIX" was used. The nano indentation was performed under the following conditions. Specifically, a Berkovich indenter was used as the indenter, a test mode was set to be an indentation depth setting test, and the indentation depth was 200 nm. The indentation hardness $H_{IT}$ was measured. At least 25 points were randomly set on the surface of the structure as the $H_{IT}$ measurement portions. An average value of $H_{IT}$ measured at 25 points or more was obtained as the hardness. The results are as illustrated in Table 2.

Measurement of Fluorine Penetration Depth

The fluorine (F) atom concentration (%) relative to the sputtering time was measured for the surfaces of Samples 2, 4, 5, and 6 after Standard Plasma Tests 1 to 3, using X-ray Photoelectron Spectroscopy (XPS) and through depth direction analysis using ion sputtering. Then, a probe type surface shape measurement device was used to measure a level difference (s) between portions subjected and not subjected to the ion sputtering, to convert the sputtering time into depth. Based on the level difference (s) and the total sputtering time (t) used in the XPS, the depth (e) relative to the sputtering unit time was calculated by e=s/t. Then, the sputtering time was converted into depth using the depth (e) relative to the sputtering unit time. Finally, the depth from the sample surface and the fluorine (F) atom concentration (%) at the depth position were calculated.

The following tables illustrates the depths from the surface of the structure after Standard Plasma Tests 1 to 3 and the fluorine atom concentrations.

After Standard Plasma Test 1:

TABLE 3

| Sample | 30 nm | 20 nm | 15 nm | 10 nm | 5 nm |
|---|---|---|---|---|---|
| 2 | 0% | 0.35% | 1.27% | 17.1% | 28.9% |
| 4 | 0.26% | 0% | 1.06% | 4.46% | 32.4% |
| 5 | 1.33% | 1.97% | 3.06% | 7.16% | 29.5% |
| 6 | 3.85% | 4.97% | 5.65% | 9.26% | 36.1% |

After Standard Plasma Test 2:

TABLE 4

| Sample | 30 nm | 20 nm | 15 nm | 10 nm | 5 nm |
|---|---|---|---|---|---|
| 2 | 0% | 0% | 0% | 0% | 0.61% |
| 4 | 0% | 0% | 0.37% | 0.39% | 0.66% |
| 5 | 0.90% | 0.98% | 1.15% | 1.21% | 1.38% |
| 6 | 2.58% | 2.88% | 3.11% | 3.41% | 3.55% |

After Standard Plasma Test 3:

TABLE 5

| Sample | 30 nm | 20 nm | 15 nm | 10 nm | 5 nm |
|---|---|---|---|---|---|
| 1 | — | — | 0.38% | 0.60% | 3.72% |
| 2 | 0.55% | 0.33% | 0.51% | 0.83% | 4.95% |
| 4 | 0.45% | 0.74% | 0.86% | 1.32% | 5.73% |
| 5 | 6.04% | 6.65% | 7.12% | 7.15% | 10.5% |
| 6 | 6.97% | 8.09% | 8.62% | 9.03% | 12.1% |

Figure 2:
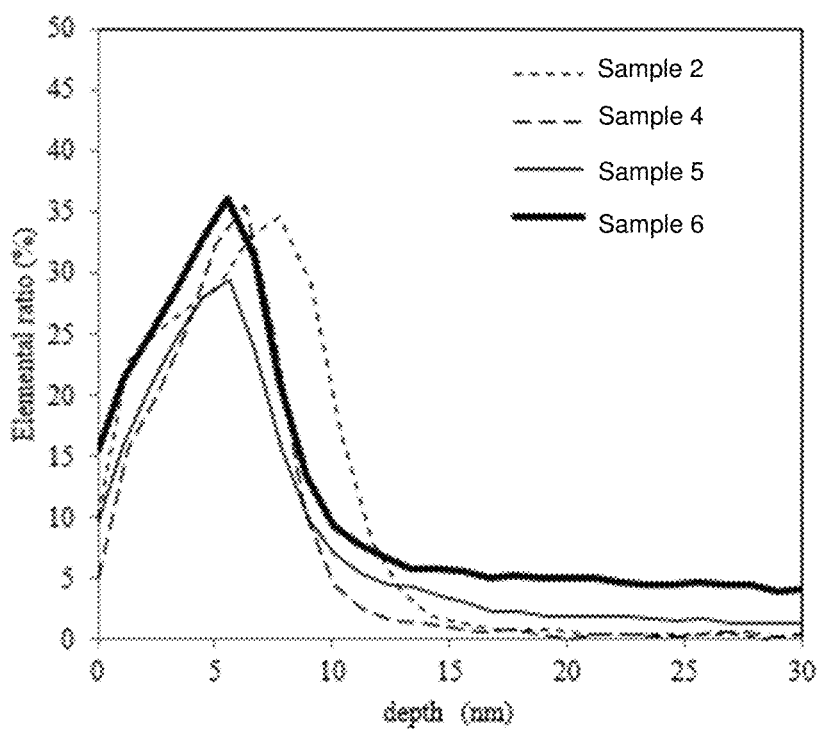
FIG. 2 is a graph illustrating a relationship between a depth from the surface of a structure after Standard Plasma Test 1 and a fluorine atom concentration.
Figure 3:
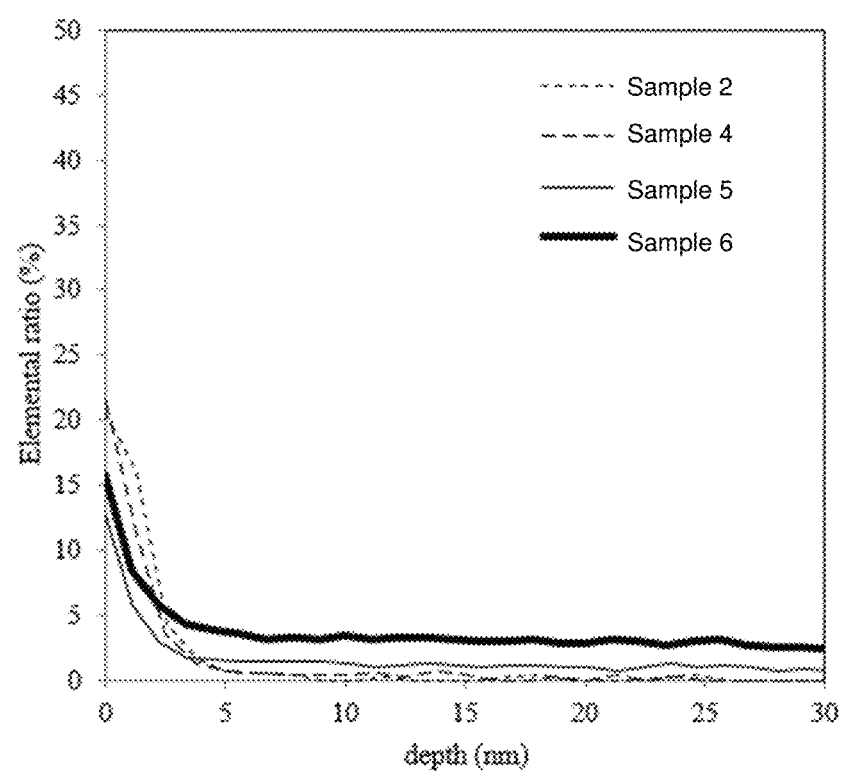
FIG. 3 is a graph illustrating a relationship between a depth from the surface of a structure after Standard Plasma Test 2 and a fluorine atom concentration.
Figure 4:
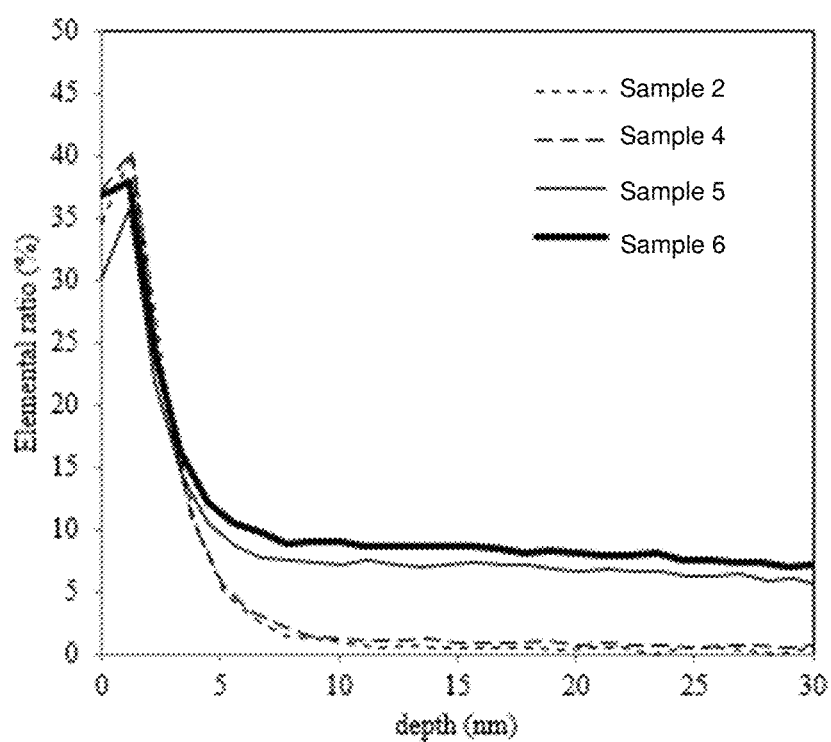
FIG. 4 is a graph illustrating a relationship between a depth from the surface of a structure after Standard Plasma Test 3 and a fluorine atom concentration.

FIGS. 2 to 4 are graphic representations of the data described above.

SEM Image

Figure 5:
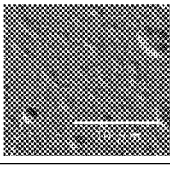
FIG. 5 is SEM images of the surface of the structure after Standard Plasma Tests 1 to 3.

The SEM image of the surface of the structures after Standard Plasma Tests 1 to 3 was captured as follows. Specifically, a Scanning Electron Microscope (SEM) was used, and the corrosion status on the plasma exposed surface was evaluated. As the SEM, "SU-8220/available from Hitachi" was used. The acceleration voltage was 3 kV. FIG. 5 illustrates the resultant photographs.

Evaluation Result

As illustrated in Table 2, the indentation hardness of the structure of Sample 6 was 8.4 GPa which is smaller than 8.5 GPa. Under the conditions of any of Standard Plasma Tests 1 to 3, Sample 6 resulted in a large impact of the plasma corrosion, a large recessed portion of a crater shape on the surface of the structure after the plasma test, and many minute recesses and protrusion found overlapping on the recessed portion, meaning that the low-particle generation was not achieved.

On the other hand, Sample 5 with the indentation hardness of the structure being 10.6 GPa which is greater than 10 GPa resulted in a plurality of large recessed portions of a crater shape after Standard Plasma Tests 1 and 2, but involved almost no minute recesses and protrusion overlapping with the recessed portions as compared with Sample 6 and involves only a slight corrosion after Standard Plasma Test 3, meaning that low-particle generation was achieved.

Samples 2 and 4 with the indentation hardness of the structure respectively being 13.8 GPa and 13.1 GPa which are greater than 13 GPa resulted in only a few large recessed portions with a crater shape found as a result of plasma exposure after Standard Plasma Tests 1 and 2. Furthermore, almost no corrosion was found after Standard Plasma Test 3. These fact suggest achievement of extremely high low-particle generation.

After Standard Plasma Test 1 using $CHF_3$ gas, Samples 2, 4, and 5 resulted in the fluorine atom concentration at the depth of 30 nm from the surface, $F1_{30\ nm}$, respectively being 0%, 0.26%, and 1.33% which are all less than 3%, and resulted in the fluorine atom concentration at the depth of 20 nm from the surface, $F1_{20\ nm}$, respectively being 0.35%, 0%, and 1.97% which are all less than 4%. It was found that Samples 2, 4, and 5 involved a small impact of the plasma corrosion inside the structure. Samples 2 and 4 resulted in $F1_{30\ nm}$ and $F1_{20\ nm}$ each being 1% or less. Thus, it can be found that the impact of the plasma corrosion inside the structure is particularly small.

On the other hand, Sample 6 resulted in the fluorine atom concentration $F1_{30\ nm}$ of 3.85% and the fluorine atom concentration $F1_{20\ nm}$ of 4.97%, which are high, and thus the plasma corrosion inside the structure was confirmed.

After Standard Plasma Test 2 involving the use of $SF_6$ gas and bias application, Samples 2, 4, and 5 resulted in the fluorine atom concentration at the depth of 30 nm from the surface, $F2_{30\ nm}$, respectively being 0%, 0%, and 0.90% which are all less than 2%, and resulted in the fluorine atom concentration at the depth of 15 nm from the surface, $F2_{15\ nm}$, respectively being 0%, 0.37%, and 1.15% which are all less than 3%. Thus, it was confirmed that Samples 2, 4, and 5 resulted in a small impact of the plasma corrosion inside the structure. Furthermore, Samples 2 and 4 resulted in $F2_{30\ nm}$ and $F2_{15\ nm}$ each being 1% or less, and thus involved a particularly small impact of the plasma corrosion inside the structure.

On the other hand, Sample 6 resulted in the fluorine atom concentration $F2_{30\ nm}$ being 2.58%, and concentration $F2_{15\ nm}$ being 3.11% which are high, and thus the plasma corrosion inside the structure was confirmed.

After Standard Plasma Test 3 using $SF_6$ gas but involving no bias application, Samples 2 and 4 resulted in the fluorine atom concentration at the depth of 20 nm from the surface, $F3_{20\ nm}$, respectively being 0.55% and 0.45% which are both 1% or less, and resulted in the fluorine atom concentration at the depth of 10 nm from the surface, $F3_{10\ nm}$, respectively being 0.83% and 1.32% which are both 2% or less. Thus, it was confirmed that Samples 2 and 4 involved particularly small impact of the plasma corrosion inside the structure.

Sample 5 resulted in the fluorine atom concentration $F3_{20\ nm}$ of 6.65% which is less than 8%, and the fluorine atom concentration $F3_{10\ nm}$ of 7.15% which is less than 9%. Sample 5 was confirmed to involve plasma corrosion inside the structure, as compared with Samples 2 and 4.

On the other hand, Sample 6 resulted in the fluorine atom concentration $F3_{20\ nm}$ of 8.09% and the fluorine atom concentration $F3_{10\ nm}$ of 9.03% which were the highest, and thus can be found to involve heavy plasma corrosion inside the structure.

Based on the results described above, in Table 2, "A" indicates that the impact of the plasma corrosion was small after any of Standard Plasma Tests 1 to 3, "B" indicates that the impact of the plasma corrosion was small after any one of Standard Plasma Tests 1 to 3, "C" indicates that the impact of the plasma corrosion was found under the condition of any of Standard Plasma Tests 1 to 3.

The embodiments of the present invention are described above. However, the present invention is not limited to the description thereof. Modes as a result of design change on the embodiments described above by a person skilled in the art are also included in the scope of the present invention as long as the modes have the features of the present invention. For example, the shape, dimension, material, arrangement, of the structure or the base material are not limited to those exemplified, and can be changed as appropriate. The elements of the embodiments described above can be combined as long as such combinations are technically reasonable. The combinations are included in the scope of the present invention as long as the combinations have the features of the present invention.

What is claimed is:

1. A composite structure comprising: a base material; and a structure provided on the base material and has a surface, wherein the structure comprises $Y_3Al_5O_{12}$ as a main component, and has an indentation hardness being larger than 8.5 GPa where the indentation hardness is measured by performing nano indentation on the surface of the structure with a Berkovich indenter used as an indenter, and with an indentation depth being a fixed value of 200 nm, wherein an average crystallite size of the structure is less than 50 nm.

2. The composite structure according to claim 1, wherein the indentation hardness is 10 GPa or more.

3. The composite structure according to claim 1, wherein the indentation hardness is 13 GPa or more.

4. The composite structure according to claim 1, wherein the indentation hardness is 20 GPa or more.

5. The composite structure according to claim 1, wherein after Standard Plasma Test 1, a fluorine atom concentration at a depth of 30 nm from the surface of the structure, $F1_{30\ nm}$, is less than 3% and/or a fluorine atom concentration at a depth of 20 nm from the surface, $F1_{20\ nm}$ is less than 4%, wherein the Standard Plasma Test 1 is carried out by exposing the composite structure to a plasma environment for one hour using an Inductively Coupled Plasma Reactive Ion Etching (ICP-RIE) apparatus where the chamber pressure is 0.5 Pa, a process gas is a mixture of $CHF_3$ (100 sccm) and $O_2$ (10 sccm), a power output is 1500 W (ICP coil output), and bias output is 750 W, wherein the fluorine atom concentration is measured by X-ray Photoelectron Spectroscopy (XPS) and through depth direction analysis using ion sputtering.

6. The composite structure according to claim 5, wherein at least one of the fluorine atom concentration $F1_{30\ nm}$, or the fluorine atom concentration $F1_{20\ nm}$ is 2% or less.

7. The composite structure according to claim 1, wherein after Standard Plasma Test 2, a fluorine atom concentration at the depth of 30 nm from the surface, $F2_{30\ nm}$, is less than 2%, and/or a fluorine atom concentration at the depth of 15 nm from the surface, $F2_{15\ nm}$, is less than 3%, wherein the Standard Plasma Test 2 is carried out by exposing the composite structure to a plasma environment for one hour using an Inductively Coupled Plasma Reactive Ion Etching (ICP-RIE) apparatus where the chamber pressure is 0.5 Pa, a process gas is $SF_6$ (100 sccm), a power output is 1500 W (ICP coil output), and bias output is 750 W, wherein the fluorine atom concentration is measured by X-ray Photoelectron Spectroscopy (XPS) and through depth direction analysis using ion sputtering.

8. The composite structure according to claim 7, wherein the fluorine atom concentration $F2_{30\ nm}$ is 1% or less and/or the fluorine atom concentration $F2_{15\ nm}$ is 2% or less.

9. The composite structure according to claim 1, wherein after a Standard Plasma Test 3, a fluorine atom concentration at the depth of 20 nm from the surface, $F3_{20\ nm}$, is less than 8%, and/or a fluorine atom concentration at the depth of 10 nm from the surface, $F3_{10\ nm}$, is less than 9%, wherein the Standard Plasma Test 3 is carried out by exposing the composite structure to a plasma environment for one hour using an Inductively Coupled Plasma Reactive Ion Etching (ICP-RIE) apparatus where the chamber pressure is 0.5 Pa, a process gas is $SF_6$ (100 sccm), a power output is 1500 W (ICP coil output), and bias output is off (0 W), wherein the fluorine atom concentration is measured by X-ray Photoelectron Spectroscopy (XPS) and through depth direction analysis using ion sputtering.

10. The composite structure according to claim 9, wherein the fluorine atom concentration $F3_{20\ nm}$ is 7% or less and/or the fluorine atom concentration $F3_{10\ nm}$ is 8% or less.

11. The composite structure according to claim 9, wherein the fluorine atom concentration $F3_{20\ nm}$ is 1% or less and/or the fluorine atom concentration $F3_{10\ nm}$ is 2% or less.

12. The composite structure according to claim 1 used in an environment requiring low-particle generation.

13. The composite structure according to claim 12 that is a member for a semiconductor manufacturing apparatus.

14. A semiconductor manufacturing apparatus comprising the composite structure according to claim 1.

* * * * *